: (12) United States Patent
Li et al.

(10) Patent No.: US 10,943,816 B2
(45) Date of Patent: Mar. 9, 2021

(54) MASK REMOVAL FOR TIGHT-PITCHED NANOSTRUCTURES

(71) Applicant: International Business Machines Corporation, Armonk, NY (US)

(72) Inventors: Juntao Li, Cohoes, NY (US); Kangguo Cheng, Schenectady, NY (US); ChoongHyun Lee, Renssalaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/374,279

(22) Filed: Apr. 3, 2019

(65) Prior Publication Data

US 2020/0321245 A1    Oct. 8, 2020

(51) Int. Cl.
*H01L 21/768* (2006.01)
*H01L 21/033* (2006.01)
*H01L 21/308* (2006.01)
*H01L 21/311* (2006.01)

(52) U.S. Cl.
CPC .... *H01L 21/76816* (2013.01); *H01L 21/0332* (2013.01); *H01L 21/0337* (2013.01); *H01L 21/3081* (2013.01); *H01L 21/3086* (2013.01); *H01L 21/31144* (2013.01)

(58) Field of Classification Search
CPC ........... H01L 21/3081; H01L 31/30604; H01L 21/31111; H01L 21/475
See application file for complete search history.

(56) References Cited

U.S. PATENT DOCUMENTS

| | | | |
|---|---|---|---|
| 8,338,310 B2 | 12/2012 | Jung et al. | |
| 8,617,996 B1 | 12/2013 | Chi et al. | |
| 8,658,536 B1 | 2/2014 | Choi et al. | |
| 9,196,499 B2 * | 11/2015 | Wei | H01L 21/823431 |
| 9,679,771 B1 | 6/2017 | Chen | |
| 9,793,164 B2 | 10/2017 | Machkaoutsan et al. | |
| 9,818,611 B2 | 11/2017 | deVilliers | |
| 10,002,786 B1 | 6/2018 | Licausi et al. | |
| 10,056,291 B2 | 8/2018 | Law et al. | |
| 2018/0024443 A1 | 1/2018 | Wittebrood | |
| 2018/0076092 A1 | 3/2018 | Gronheid et al. | |
| 2018/0114699 A1 | 4/2018 | Mohanty | |

OTHER PUBLICATIONS

Disclosed Anonymously, "Self-Aligned Gate Isolation Process for FINFET CMOS Beyond 10nm," IP.com No. IPCOM000245702D, Mar. 31, 2016, 7 pages.

* cited by examiner

*Primary Examiner* — Ermias T Woldegeorgis
(74) *Attorney, Agent, or Firm* — Douglas Pearson; Ryan, Mason & Lewis, LLP (57) ABSTRACT

A method for manufacturing a semiconductor device includes forming a hardmask layer on a substrate, and patterning the hardmask layer into a plurality of hardmask portions. The method also includes forming a liner layer on the plurality of hardmask portions, and removing a portion of the liner layer from at least one hardmask portion of the plurality of hardmask portions. The removing exposes one or more surfaces of the at least one hardmask portion. In the method, the at least one hardmask portion and a remaining portion of the liner layer are removed. A pattern of remaining ones of the plurality of hardmask portions are transferred to the substrate to form one of a plurality of patterned substrate portions and a plurality of openings in the substrate.

11 Claims, 7 Drawing Sheets

MASK REMOVAL FOR TIGHT-PITCHED NANOSTRUCTURES

BACKGROUND

Semiconductor devices, such as, for example, complementary metal-oxide semiconductor (CMOS) devices are continuously being scaled down to smaller dimensions. As components are scaled down and devices are being formed closer together, improved processing for forming tight pitch structures are needed. Self-aligned multiple-patterning (SAMP), including, but not necessarily limited to, self-aligned double patterning (SADP), self-aligned quadruple patterning (SAQP) and self-aligned octule patterning (SAOP), has been widely used to form tight pitch structures.

However, due to smaller critical dimensions and increasingly tighter pitches between fins or contact lines, it has become difficult to precisely remove hardmasks during SAMP processing where spaces in resulting structures may be desired.

SUMMARY

According to an exemplary embodiment of the present invention, a method for manufacturing a semiconductor device includes forming a hardmask layer on a substrate, and patterning the hardmask layer into a plurality of hardmask portions. The method also includes forming a liner layer on the plurality of hardmask portions, and removing a portion of the liner layer from at least one hardmask portion of the plurality of hardmask portions. The removing exposes one or more surfaces of the at least one hardmask portion. In the method, the at least one hardmask portion and a remaining portion of the liner layer are removed. A pattern of remaining ones of the plurality of hardmask portions are transferred to the substrate to form one of a plurality of patterned substrate portions and a plurality of openings in the substrate.

According to an exemplary embodiment of the present invention, a method for manufacturing a semiconductor device includes conformally depositing a dielectric liner layer on a plurality of hardmask portions spaced apart from each other on a substrate. In the method, a portion of the dielectric liner layer is removed from at least one hardmask portion of the plurality of hardmask portions, which exposes one or more surfaces of the at least one hardmask portion. The method also includes removing the at least one hardmask portion, and removing a remaining portion of the dielectric liner layer. A pattern of remaining ones of the plurality of hardmask portions is transferred to the substrate to form one of a plurality of patterned substrate portions and a plurality of openings in the substrate.

According to an exemplary embodiment of the present invention, a method for manufacturing a semiconductor device includes forming a hardmask layer on a substrate, and patterning the hardmask layer into a plurality of hardmask portions. The method also includes forming a liner layer on the plurality of hardmask portions, and forming a mask on the substrate and on the plurality of hardmask portions including the liner layer formed thereon. In the method, at least one opening is formed in the mask, and a portion of the liner layer is removed from at least one hardmask portion of the plurality of hardmask portions through the at least one opening in the mask. The removing of the portion of the liner layer exposes one or more surfaces of the at least one hardmask portion, and the at least one hardmask portion is removed.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Exemplary embodiments of the invention will now be discussed in further detail with regard to semiconductor devices and methods of manufacturing same and, in particular, to the removal of portions of a hardmask pattern for a tight pitch structure from a substrate.

It is to be understood that the various layers and/or regions shown in the accompanying drawings are not drawn to scale, and that one or more layers and/or regions of a type commonly used in, for example, a complementary metal-oxide semiconductor (CMOS), field-effect transistor (FET), nanowire FET, fin field-effect transistor (FinFET), metal-oxide-semiconductor field-effect transistor (MOSFET), vertical FET, single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, FinFETs, nanowire FETs, nanosheet FETs, vertical FETs, SETs, CMOSs and/or MOSFETs. By way of non-limiting example, the semiconductor devices can include, but are not necessarily limited to FET, FinFET, nanowire FET, nanosheet FET, vertical FET, SET, CMOS and MOSFET devices, and/or semiconductor devices that use FET, FinFET, nanowire FET, nanosheet FET, vertical FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the three-dimensional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the three-dimensional and/or cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Figure 1:
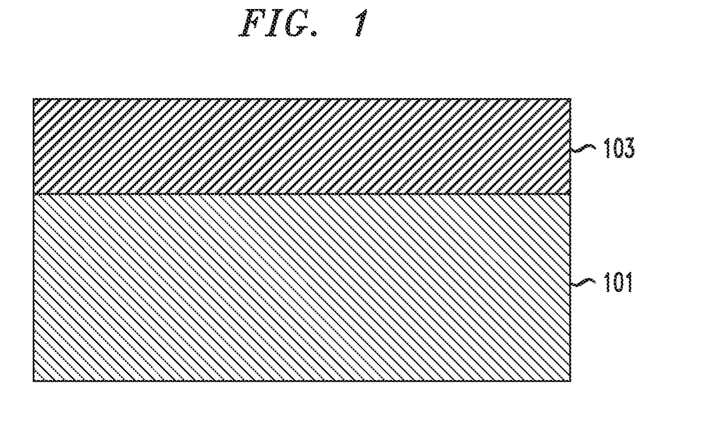
FIG. 1 is a cross-sectional view illustrating a hardmask layer formed on a substrate in a method of manufacturing a semiconductor device, according to an exemplary embodiment of the present invention.

Referring to FIG. 1, a hardmask layer 103 including, for example, a nitride material, such as, but not necessarily limited to, silicon nitride (SiN) or titanium nitride (TiN), is formed on a substrate 101. The hardmask layer 103 can be deposited using deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. In some embodiments, a planarization process, such as, chemical mechanical planarization (CMP) can be used to remove excess dielectric material. A height of the hardmask layer 103 can be in the range of, but is not necessarily limited to, 20 nm to 100 nm.

The material of substrate may depend on application. For example, the substrate 101 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V compound semiconductor or other like semiconductor. In addition, multiple layers of the semiconductor materials can be used as the semiconductor material of the substrate. In some embodiments, the substrate 101 includes both semiconductor materials and dielectric materials, for example, a layer of dielectric material on top of a layer of semiconductor material. In some embodiments, the substrate 101 includes other device structures such as transistors, isolation structures (such as shallow trench isolations), contacts, conducting wires, etc.

Alternatively, as described in connection with FIGS. 11-14 herein below, the substrate 201 is formed of a dielectric material such as, but not necessarily limited to, low-k dielectric or ultra low-k (ULK) dielectric materials, such as, for example, a silicon oxycarbide, like SiOCH or any suitable dielectric. In some embodiments, the substrate 201 includes other device structures such as transistors, isolation structures (such as shallow trench isolation regions), contacts, conducting wires, etc.

Figure 2:
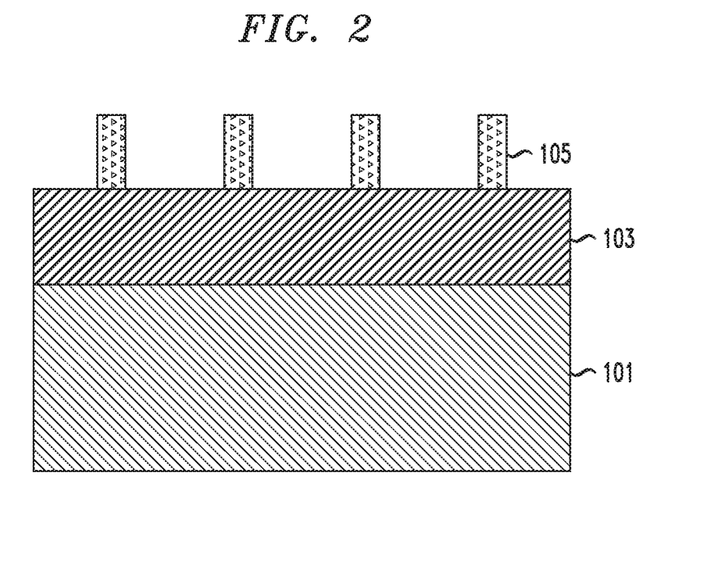
FIG. 2 is a cross-sectional view illustrating formation of spacers to be used as masks for patterning of the hardmask layer in a method of manufacturing a semiconductor device, according to an exemplary embodiment of the present invention.

Referring to FIG. 2, spacers 105 to be used as masks for patterning the hardmask layer 103 are formed to be spaced apart from each other on the hardmask layer 103. In order to form the spacers 105, a plurality of mandrels (not shown) comprising, but not necessarily limited to, amorphous silicon (a-Si), amorphous carbon, polycrystalline silicon, polycrystalline silicon germanium, amorphous silicon germanium, polycrystalline germanium, and/or amorphous germanium, are patterned on hardmask layer 103 on the substrate 101. The mandrel patterning can be done by various patterning techniques, including, but not necessarily limited to, lithography patterning followed by directional etching and/or a sidewall image transfer (SIT) process, for example. In some embodiments, the process includes using lithography followed by directional etching (e.g., reactive ion etch (ME)) to form a mandrel. After the mandrel formation, a conformal film can be deposited and then followed by an etchback process (e.g., ME). The conformal film will form spacers 105 at both sides of each mandrel. The spacer material can include, but is not limited, an oxide, such as silicon oxide (e.g., $SiO_2$ or $SiO_x$), formed by low-pressure chemical vapor deposition (LPCVD), PECVD, sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, or limited reaction processing CVD (LRPCVD). Alternatively, some other dielectric materials, such as silicon oxycarbonitride (SiOCN), silicon carbonitride (SiCN), siliconoxycarbide (SiOC), can be used. A height of the spacers 105 can be in the range of, but is not necessarily limited to, 30 nm to 100 nm.

Figure 3:
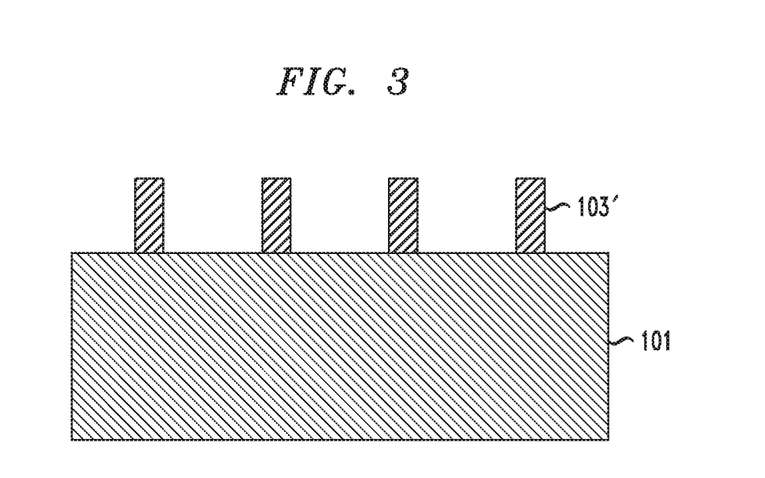
FIG. 3 is a cross-sectional view illustrating a hardmask pattern on a substrate in a method of manufacturing a semiconductor device, according to an exemplary embodiment of the present invention.

Referring to FIG. 3, the hardmask layer 103 is patterned into a plurality of patterned hardmask portions 103' corresponding to the locations of the spacers 105. Exposed portions of the hardmask layer 103 not under the spacers 105 (e.g., not masked by the spacers 105) are removed using, for example, a directional etching process, comprising ME composed of $CF_8$, or $CH_2F_2$ or other chemistry as is known to etch silicon nitride selective to other materials. The patterning of the hardmask layer 103 into the plurality of patterned hardmask portions 103' spaced apart from each other can be performed using, for example, SAMP techniques, including, but not necessarily limited to, SADP, SAQP and SAOP. Non-limiting ranges in connection with the hardmask portions 103' include, for vertical height, 50 nm to 100 nm, for lateral width, 8 nm to 20 nm, and for pitch (lateral distance between centers of adjacent hardmask portions), 30 nm to 80 nm.

Figure 4:
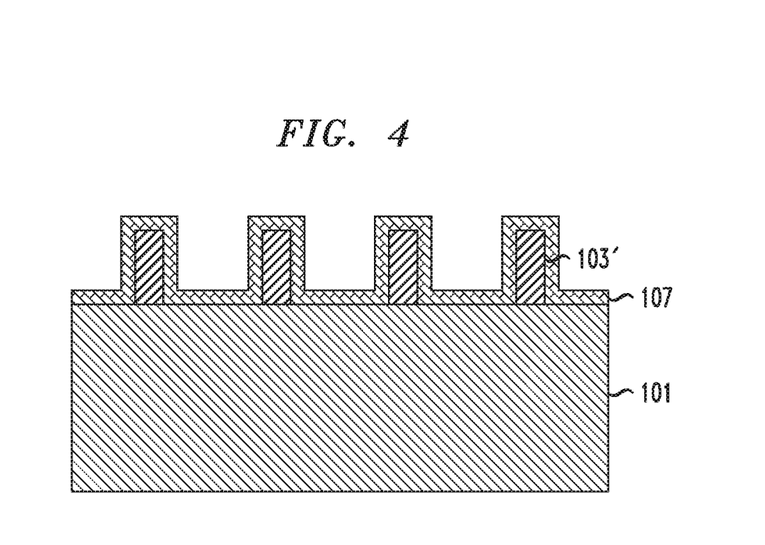
FIG. 4 is a cross-sectional view illustrating liner layer deposition in a method of manufacturing a semiconductor device, according to an exemplary embodiment of the present invention.

Referring to FIG. 4, following removal of the spacers 105 from the plurality of patterned hardmask portions 103', a liner layer 107 is conformally deposited on the substrate 101 and on the plurality of patterned hardmask portions 103'.

The liner layer 107 can be deposited using for example, a conformal deposition process including, but not necessarily limited to, ALD or CVD. The liner layer 107 may include, for example, an oxide, such as but not necessarily limited to silicon oxide, silicon oxynitrides, or carbon-doped silicon oxide (SiCO). A thickness of the liner layer 107 with respect to the substrate 101 or the patterned hardmask portions 103' is controlled based on desired critical dimension and pitch so that there is no pinching off of the liner layer 107 between hardmask portions 103'. For example, in an embodiment, the thickness of the liner layer 107 is in the range of about 5 nm-about 8 nm, but is not necessarily limited thereto.

Figure 5:
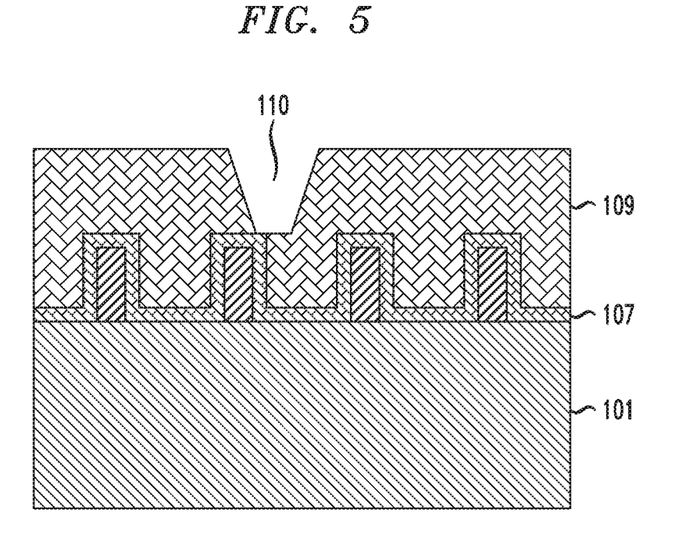
FIG. 5 is a cross-sectional view illustrating cut mask formation and patterning in a method of manufacturing a semiconductor device, according to an exemplary embodiment of the present invention.

Referring to FIG. 5, a mask 109, such as, for example, a photoresist including an optical planarization layer (OPL), is formed on the substrate 101 and on and around the patterned hardmask portions 103' including the liner layer 107 thereon. The mask 109 includes one or more openings 110 corresponding to the patterned hardmask portions 103' that are to be removed. In accordance with the discussion herein, for purposes of illustration, one hardmask portion 103' is described as being removed. However, the embodiments are not necessarily limited to the removal of one hardmask portion 103'. Based on the desired resulting structure of fins or conductive regions, more patterned hardmask portions 103' to be removed can be exposed through one or more openings in the mask 109.

As can be seen in FIG. 5, although the opening 110 may not necessarily be formed over and/or directly expose the hardmask portion 103', the opening 110 in the mask 109 exposes part of the liner layer 107 formed on a hardmask portion 103'. As explainer further herein below in connection with FIGS. 6-8, the exposure by the opening 110 of a portion of the liner layer 107 on the hardmask portion 103' is sufficient to enable removal of that underlying hardmask portion 103'.

Given the presence of the liner layer 107, the overlay tolerance for the opening 110 is defined by equation (1):

$$\text{Overlay tolerance} = \frac{1}{2}(\text{HM CD} + 2*(\text{liner thickness}) - \text{BCD}) \quad (1)$$

In equation (1), "HM CD" refers to the critical dimension (e.g., width) of the hardmask portion 103', "liner thickness" refers to the thickness of the liner layer 107 on the hardmask portion 103', which is multiplied by 2 since the liner layer 107 is on left and right sides of the hardmask portion 103', and "BCD" refers to bottom critical dimension, which is the lateral width at the bottom of the opening 110 in FIG. 5. Due to the difficulty of matching openings in a mask (e.g., opening 110 in mask 109) with underlying hardmask portions 103' to be removed in tight pitch structures, the liner layer 107 increases a width of an operation region by twice the thickness of the liner layer 107. As a result, the likelihood is increased that an opening in a mask (e.g., opening 110 in mask 109) can be used to remove a corresponding hardmask portion 103' for which removal is desired. As can be understood in more detail by the subsequent process descriptions in FIGS. 6-8, the presence of the liner layer 107 increases overlay tolerance by twice the thickness of the liner layer 107.

According to an embodiment, if an opening in the mask 109, like opening 110, is formed to be too large (e.g., overlaps more than the desired hardmask portions 103' to be removed), an inner spacer layer (not shown) may be deposited to line lateral sides of the opening to decrease a critical dimension (e.g., width) of the opening. The material of the inner spacer layer can include, for example, SiCO.

Figure 6:
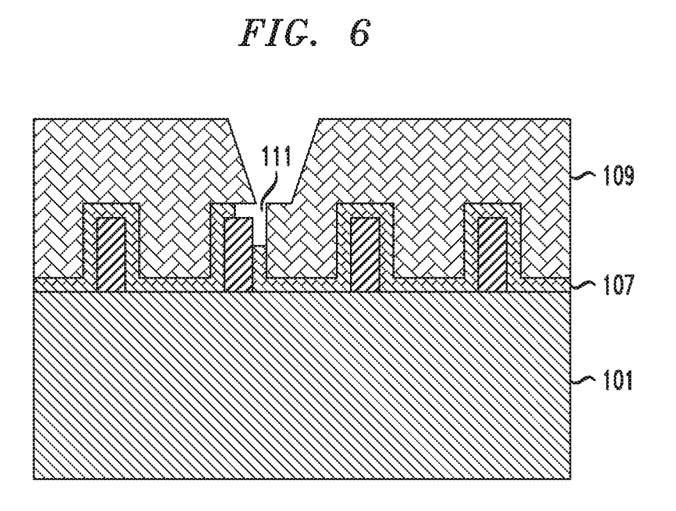
FIG. 6 is a cross-sectional view illustrating removal of a portion of the liner layer through an opening in a cut mask in a method of manufacturing a semiconductor device, according to an exemplary embodiment of the present invention.

Referring to FIG. 6, a portion of the liner layer 107 exposed through the opening 110 in the cut mask 109 is removed to result in one or more exposed surfaces 111 of a hardmask portion 103'. In this case, top and side surfaces of a hardmask portion 103' are exposed. According to an embodiment, the portion of the liner layer 107 is removed using, for example, an isotropic etching process. In the case of a liner layer 107 including, for example, an oxide, the isotropic etch is performed using, for example, a wet etch process including hydrofluoric acid (HF), or dry etch process such as chemical oxide removal (COR). As can be seen in FIG. 6, it is sufficient to remove enough of the liner layer 107 to expose part of the hardmask portion 103' to be removed without removing all of the liner layer 107 around that hardmask portion 103'.

Figure 7:
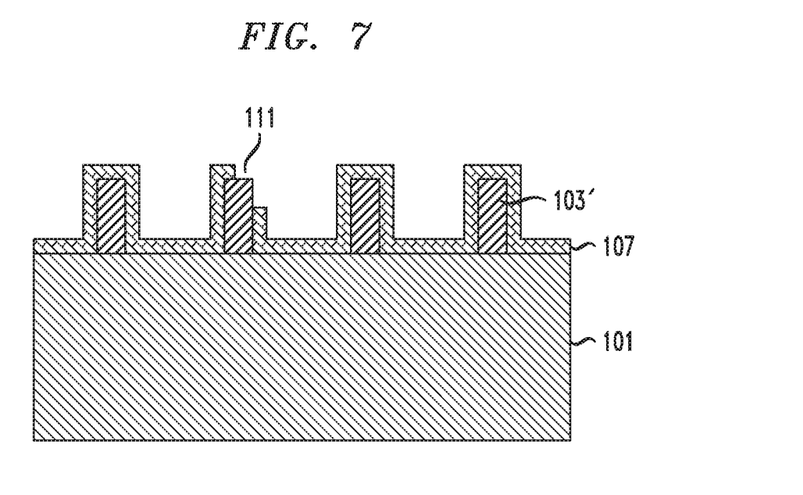
FIG. 7 is a cross-sectional view illustrating cut mask removal in a method of manufacturing a semiconductor device, according to an exemplary embodiment of the present invention.

Referring to FIG. 7, the mask 109 is removed from the substrate 101 including the patterned hardmask portions 103' and the remaining portions of the liner payer 107 using, for example, an oxygen plasma etch.

Figure 8:
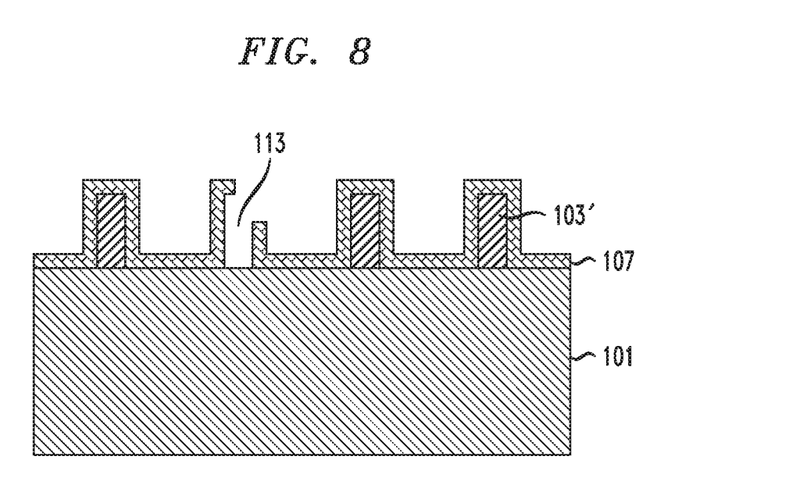
FIG. 8 is a cross-sectional view illustrating removal of an exposed patterned hardmask portion from the hardmask pattern in a method of manufacturing a semiconductor device, according to an exemplary embodiment of the present invention.

Referring to FIG. 8, the exposed patterned hardmask portion 103' is removed using, for example, an isotropic etching process such as, for example, a wet etch (phosphoric acid for SiN), or a dry etch such as RIE. The etchant selectively etches the material of the hardmask portion 103' with respect to the material of the liner layer 107. The liner layer 107 covering the other hardmask portions 103' acts a mask to prevent removal of the other hardmask portions 103' during the etching of the exposed hardmask portion 103'.

Figure 9:
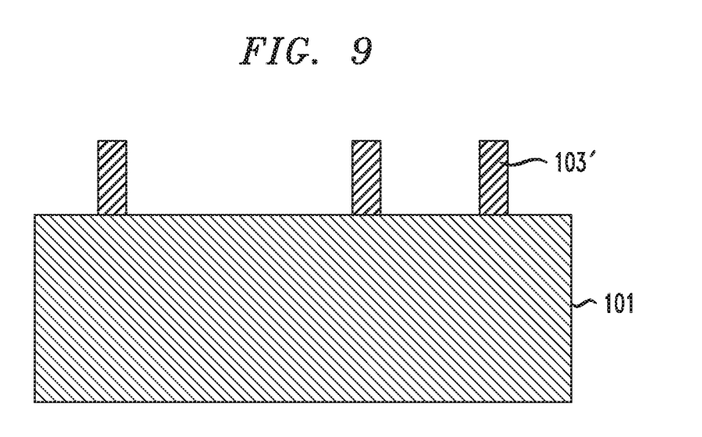
FIG. 9 is a cross-sectional view illustrating removal of the liner layer and remaining patterned hardmask portions on a semiconductor substrate in a method of manufacturing a semiconductor device, according to an exemplary embodiment of the present invention.

Referring to FIG. 9, the remaining liner layer 107 is removed from the patterned hardmask portions 103' and the substrate 101 using any suitable etch process, for example, a wet etch process including hydrofluoric acid (HF).

Figure 10:
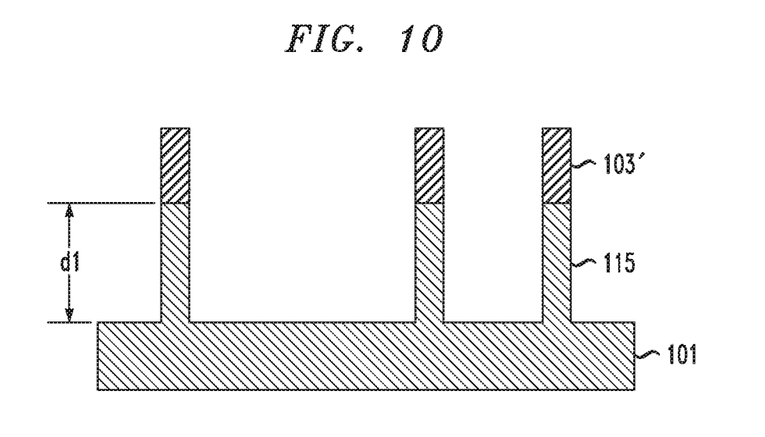
FIG. 10 is a cross-sectional view illustrating removal of exposed portions of the substrate not covered by the remaining patterned hardmask portions of the hardmask layer to form fins in a method of manufacturing a semiconductor device, according to an exemplary embodiment of the present invention.

Referring to FIG. 10, using the remaining patterned hardmask portions 103' as masks, exposed portions of the substrate 101 not covered by the hardmask portions 103' are removed to certain depth d1 (depending on design) using a substrate etch. The substrate etch transfers the pattern of the remaining hardmask portions 103' to the substrate to form patterned substrate portions 115. In accordance with an embodiment of the present invention, substrate 101 including a semiconductor material, such as, Si, SiGe, SiC, Si:C, SiGeC, SiGe:C, III-V compound semiconductor or other like semiconductor, can be selectively etched with respect to the hardmask portions 103' using, for example, a silicon RIE process, In the embodiment described in connection with FIG. 10, the processing can form patterned substrate portions 115 in a tight pitch structure, with vacancies on the substrate 101 where hardmask portions 103' were removed. The patterned substrate portions 115 can form, for example, semiconductor fins or other semiconductor structures at a close pitch with respect to each other and having relatively small critical dimensions (e.g., width). For example, the pitch can be in the range of about 30 nm to about 40 nm, but is not limited thereto, and the critical dimension of the substrate portions 115 can be in the range of about 8 nm to about 10 nm, but is not limited thereto.

In FIGS. 11-14, the substrate 201 is formed of a different material than the substrate 101. For example, the substrate 201 is formed of a dielectric material such as, but not necessarily limited to, low-k or ULK dielectric materials, such as, for example, a silicon oxycarbide, like SiOCH or any suitable dielectric. With the exception of the different substrate 201, the processing up to FIG. 11 follows the same flow as that in FIGS. 1-8. The same or similar elements to those in FIGS. 1-10 have similar reference numerals in FIGS. 11-14.

Figure 11:
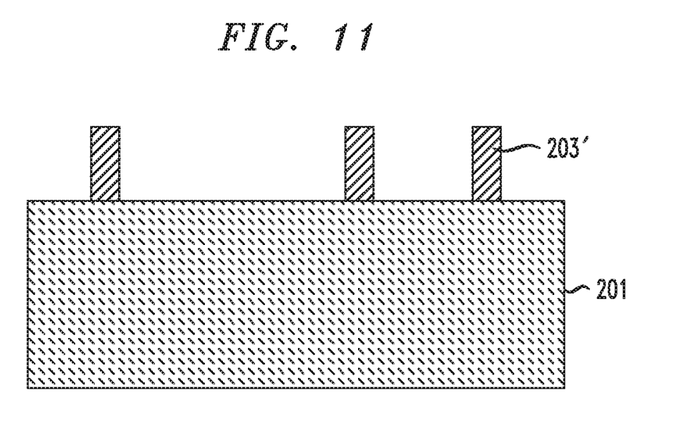
FIG. 11 is a cross-sectional view illustrating removal of a liner layer and remaining patterned hardmask portions on a dielectric substrate in a method of manufacturing a semiconductor device, according to an exemplary embodiment of the present invention.

Referring to FIG. 11, following the processing up to and including that in FIG. 8, after the removal of the patterned hardmask portion exposed through the removed portion of the liner layer, the remaining liner layer is removed from the patterned hardmask portions 203' and the substrate 201 using any suitable etch process, for example, a wet etch process including hydrofluoric acid (HF). The patterned hardmask portions 203' are the same or similar to the patterned hardmask portions 103' in FIGS. 1-10.

Figure 12:
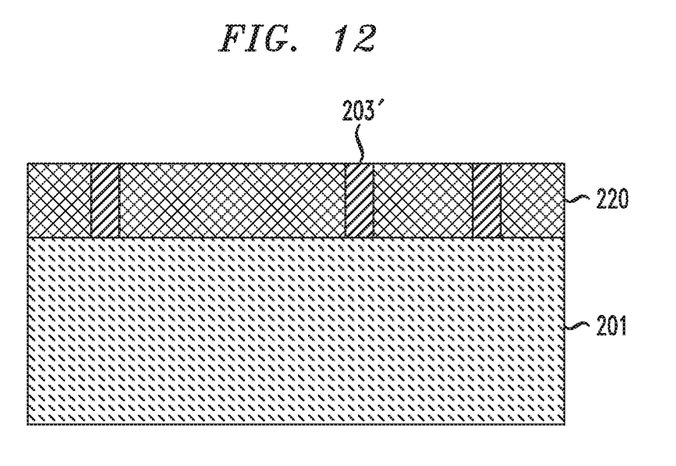
FIG. 12 is a cross-sectional view illustrating formation of a dielectric layer on the dielectric substrate and around remaining patterned hardmask portions of the hardmask layer in a method of manufacturing a semiconductor device, according to an exemplary embodiment of the present invention.

Referring to FIG. 12, a dielectric layer 220 is formed on the substrate 201 and around remaining hardmask portions 203'. The dielectric layer 220 can comprise a material so that the hardmask portions 203' can be selectively removed with respect to the dielectric layer 220. For example, according to an embodiment, the dielectric layer 220 comprises an oxide, and the hardmask portions 203' comprise SiN.

The dielectric layer 220 can be deposited using deposition techniques, including, but not necessarily limited to, CVD, LPCVD, PECVD, RFCVD, PVD, ALD, MLD, MBD, PLD, LSMCD, spin-on, and/or sputtering. The deposition can be followed by a planarization process, such as CMP, in order to planarize a top surface of the dielectric layer 220 to be coplanar with the top surfaces of the hardmask portions 203'.

Figure 13:
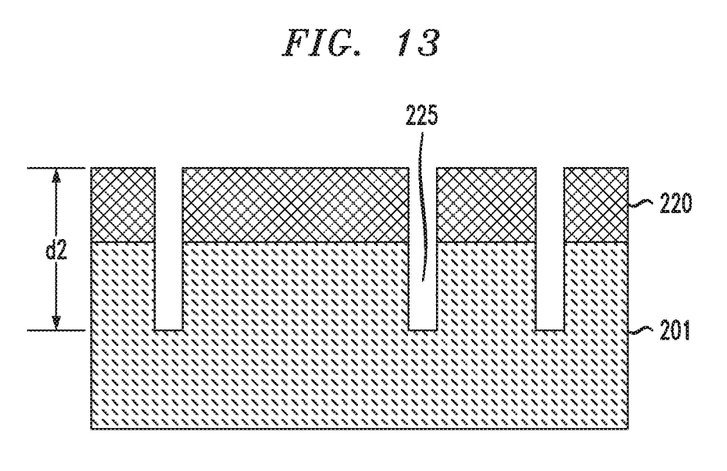
FIG. 13 is a cross-sectional view illustrating removal of the remaining portions of the hardmask layer and underlying portions of the dielectric substrate to form spaces (e.g., vacant areas) in a method of manufacturing a semiconductor device, according to an exemplary embodiment of the present invention.

Referring to FIG. 13, the hardmask layer portions 203' (e.g., SiN) are selectively removed with respect to the dielectric layer 220 (e.g., oxide) using, for example, a wet etch process including phosphoric acid, to form a plurality of openings in the dielectric layer 220 exposing portions of the substrate 201.

The exposed portions of the substrate 201 (exposed by the openings formed by the removal of the hardmask layer portions 203') are then removed down to a depth d2 (depending on design) using a substrate etch to form openings 225, effectively transferring the pattern of the hardmask layer portions 203' to the substrate 201. Depending on the material of the substrate 201, the etching of the substrate 201 to form openings 225 is selective with respect to the material of the dielectric layer 220. In accordance with an embodiment, substrate 201 including a dielectric material, such as, but not necessarily limited to, SiOCH, can be selectively etched with respect to the dielectric layer 220 using, for example, $CF_4$ or $N_2/H_2$ plasma to form openings 225.

Figure 14:
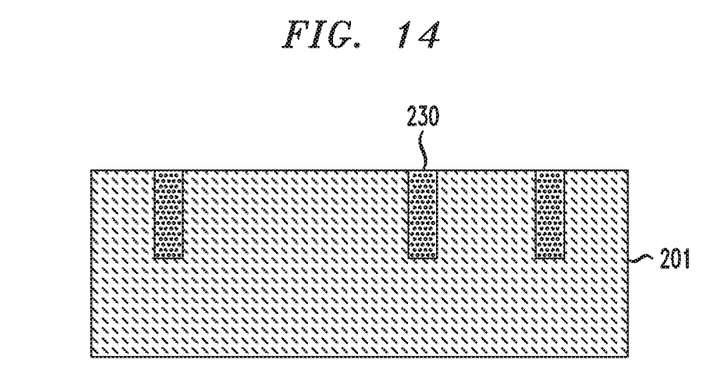
FIG. 14 is a cross-sectional view illustrating dielectric layer removal and conductive material deposition to form conductive regions in a method of manufacturing a semiconductor device in a method of manufacturing a semiconductor device, according to an exemplary embodiment of the present invention.

Referring to FIG. 14, the dielectric layer 220 formed of, for example, silicon oxide, is removed using, for example, using hydrofluoric acid (HF). According to an embodiment, the openings 225 are filled with conducting material to form conductive regions 230, such as, for example, vias, to form interconnections between devices. The conductive material can include, for example, electrically conductive material including, but not necessarily limited to, tungsten, cobalt, zirconium, tantalum, titanium, aluminum, ruthenium, and/or copper. A liner layer (not shown) including, for example, titanium and/or titanium nitride, may be formed to line side and bottom surfaces of the openings 225 before filling the openings 225 with the conductive material. Deposition of the conductive material can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

In the embodiment described in connection with FIG. 14, the processing can form conductive regions 230 in a tight pitch structure, with portions of the substrate 201 not including a conductive region where hardmask portions 203' were removed. The conductive regions 230 can form, for example, conductive vias or other conductive or contact structures at a close pitch with respect to each other and having relatively small critical dimensions (e.g., width). For example, the pitch of the conductive regions 230 can be in the range of about 30 nm to about 50 nm, but is not limited thereto, and the critical dimension of the conductive regions 230 can be in the range of about 20 nm to about 30 nm, but is not limited thereto.

In an alternative embodiment, openings such as openings 225 may be formed in a substrate formed of a semiconductor material, and the formed openings filled with dielectric material. For example, openings in a semiconductor substrate filled with dielectric material can be used as isolation regions or other insulating structures to isolate adjacent devices from each other.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
    forming a hardmask layer on a substrate;
    patterning the hardmask layer into a plurality of hardmask portions;
    forming a liner layer on the plurality of hardmask portions;
    removing a portion of the liner layer from at least one hardmask portion of the plurality of hardmask portions, wherein the removing exposes one or more surfaces of the at least one hardmask portion;
    removing the at least one hardmask portion;
    removing a remaining portion of the liner layer;
    transferring a pattern of remaining ones of the plurality of hardmask portions to the substrate to form one of a plurality of patterned substrate portions and a plurality of openings in the substrate; and
    forming a dielectric layer on the remaining ones of the plurality of hardmask portions, wherein the transferring comprises:
        selectively removing the remaining ones of the plurality of hardmask portions with respect to the dielectric layer to form a plurality of openings in the dielectric layer exposing portions the substrate; and
        etching the exposed portions of the substrate to form the plurality of openings in the substrate.

2. The method according to claim 1, further comprising forming a mask on the substrate and on the plurality of hardmask portions including the liner layer formed thereon.

3. The method according to claim 2, further comprising forming at least one opening in the mask, wherein the removing of the portion of the liner layer is performed through the at least opening in the mask.

4. The method according to claim 3, wherein the mask comprises an optical planarization layer (OPL).

5. The method according to claim 3, further comprising removing the mask prior to removing the at least one hardmask portion.

6. The method according to claim 1, wherein the plurality of hardmask portions comprise a material having an etch selectivity with respect a material of the liner layer.

7. The method according to claim 6, wherein the plurality of hardmask portions comprise a nitride and the liner layer comprises an oxide.

8. The method according to claim 1, wherein the liner layer is conformally deposited on side and top surfaces of the plurality of hardmask portions.

9. The method according to claim 1, wherein the removing of the portion of the liner layer comprises isotropically etching the portion of the liner layer.

10. The method according to claim 1, wherein the substrate comprises one of a semiconductor material and a dielectric material.

11. The method according to claim 1, further comprising filling the plurality of openings in the substrate with conductive material.

* * * * *